United States Patent
Sakai et al.

(10) Patent No.: US 8,184,303 B2
(45) Date of Patent: May 22, 2012

(54) FILM-THICKNESS MEASUREMENT METHOD AND APPARATUS THEREFOR, AND THIN-FILM DEVICE FABRICATION SYSTEM

(75) Inventors: Satoshi Sakai, Kanagawa (JP); Yoichiro Tsumura, Hiroshima (JP); Masami Iida, Nagasaki (JP); Kohei Kawazoe, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 222 days.

(21) Appl. No.: 12/517,110

(22) PCT Filed: Oct. 31, 2007

(86) PCT No.: PCT/JP2007/071180
§ 371 (c)(1),
(2), (4) Date: Dec. 4, 2009

(87) PCT Pub. No.: WO2008/114471
PCT Pub. Date: Sep. 25, 2008

(65) Prior Publication Data
US 2010/0177326 A1 Jul. 15, 2010

(30) Foreign Application Priority Data
Feb. 20, 2007 (JP) ................. 2007-039595

(51) Int. Cl.
G01B 11/28 (2006.01)
G01B 11/06 (2006.01)

(52) U.S. Cl. ....................... 356/630; 356/632

(58) Field of Classification Search ........... 356/630–632
See application file for complete search history.

(56) References Cited

U.S. PATENT DOCUMENTS
2009/0107399 A1* 4/2009 Bloess et al. ................. 118/712

FOREIGN PATENT DOCUMENTS

| JP | 62-042006 A | 2/1987 |
|---|---|---|
| JP | 64-028510 A | 1/1989 |
| JP | 07-141703 A | 6/1995 |
| JP | 10-311708 A | 11/1998 |
| JP | 2004-095731 A | 3/2004 |
| JP | 2005-134324 A | 5/2005 |
| JP | 2006-071316 | 3/2006 |

OTHER PUBLICATIONS

Japanese Office Action from corresponding Japanese Application. Office Action issued on Jul. 20, 2010 in corresponding Japanese priority application No. 2007-39595.

* cited by examiner

*Primary Examiner* — Michael P Stafira
(74) *Attorney, Agent, or Firm* — Kanesaka Berner and Partners, LLP

(57) ABSTRACT

Objects are to reduce the burden on an operator and to improve fabrication efficiency. A transparent conductive film or a transparent optical film formed on a substrate W is irradiated with line illumination light by means of a line illumination device 3, line reflected light reflected at the transparent conductive film or the transparent optical film is detected with a camera, a color evaluation value of the detected reflected light is measured, and a film thickness corresponding to the measured color evaluation value is obtained using a film-thickness characteristic in which the color evaluation value is associated with the film thickness.

8 Claims, 4 Drawing Sheets

FILM-THICKNESS MEASUREMENT METHOD AND APPARATUS THEREFOR, AND THIN-FILM DEVICE FABRICATION SYSTEM

CROSS-REFERENCE TO RELATED APPLICATIONS

The present Application is based on International Application No/ PCT/JP2007/071180, filed on Oct. 31, 2007, which in turn corresponds to Japanese Application No. 2007-039595 filed on Feb. 20, 2007, and priority is hereby claimed under 35 USC §119 based on these applications. Each of these applications are hereby incorporated by reference in their entirety into the present application.

TECHNICAL FIELD

The present invention relates to film-thickness measurement of thin films, and more particularly, to a film-thickness measurement method and apparatus therefor that perform film-thickness measurement of transparent conductive films and transparent optical films used in thin-film devices, as well as to a thin-film device fabrication system.

BACKGROUND ART

Thin-film devices include, for example, thin-film solar cells, liquid crystal panels, semiconductor devices, and so on. For example, in the field of thin-film solar cells, except for photoelectric-conversion electricity generating layers (semiconductor material such as silicon) that generate electrical current upon absorption of light, transparent conductive films and transparent optical films that form collector electrodes at the light incident side are used.

Here, taking the example of a tandem solar cell, the balance of the generated currents in a top cell and a bottom cell is corrected by forming a thin-film called an intermediate contact layer between the top cell and the bottom cell. For example, the top cell is a photoelectric conversion layer formed of amorphous silicon, the intermediate contact layer is a transparent conductive film, and the bottom cell is a photoelectric conversion layer formed of crystalline silicon.

The intermediate contact layer mentioned above reflects part of the sunlight passing transmitted through the top cell and returns it to the top cell, and also transmits the remaining light and guides it to the bottom cell. Hence, by providing the intermediate contact layer, part of the light can be returned to the top cell, and therefore, the film thickness of the top cell can be reduced while still maintaining the photoelectric effect. The ability to reduce the film thickness of the top cell is preferable from the standpoint of photodegradation, and by providing the intermediate contact layer, it is possible to improve the performance of the entire solar cell.

In such a tandem solar cell, it is necessary to make the generated currents in the top cell and the bottom cell uniform. These generated currents are adjusted by the material (refractive index) and the film thickness of the intermediate contact layer. Because the film thickness of the intermediate contact layer is thin, about 10 nm to 150 nm, if it falls outside of a suitable range, the balance of the generated currents in the top cell and the bottom cell is lost, and therefore, the generated current from the tandem solar cell is reduced, and the cell performance decreases. Therefore, in the related art, film-thickness control of this intermediate contact layer is essential, and random inspection is performed from the production line.

The transparent conductive film and the transparent optical film are not limited to the intermediate contact layer in the tandem solar cell described above; they can be used in various fields such as thin-film solar cells and multijunction thin-film solar cells, as well as electrodes of semiconductor devices such as thin-film transistors, liquid-crystal driving electrodes of liquid crystal panels, and so forth, which are subjected to film-thickness inspection as required.

A known apparatus for measuring film thickness in the related art is, for example, an interferometric film-thickness measurement apparatus in which a thin film to be measured is irradiated with light, interference of reflected light thereof and light reflected at a rear surface of the thin film is split into each wavelength, a spectral intensity distribution of the split wavelengths is created, and the film thickness is measured on the basis of this distribution (for example, see Patent Document 1).

Patent Document 1:
Japanese Unexamined Patent Application, Publication No. HEI-10-311708

DISCLOSURE OF INVENTION

When performing film-formation measurement using the above-described interferometric film-thickness measurement apparatus, it is necessary to cut out a test piece from a substrate that is removed from the manufacturing line after film-formation, to place this test piece in the interferometric film-thickness measurement apparatus, and to perform film-thickness measurement of the test piece.

Therefore, the substrate from which the test piece is cut out cannot be used as a final product, and the yield is thus reduced. Another problem is that, because an operator must cut out the test piece and place it in the test apparatus, the burden placed on the operator is increased. Further difficulties are that it is not possible to test all substrates, it takes time to obtain the evaluation result, and it is not possible to feedback the results to the manufacturing line, which reduces the production stability and decreases the yield.

A method that allows for simple online evaluation of film thickness in a manufacturing line is thus desired.

The present invention has been conceived to solve the problems described above, and an object thereof is to provide a film-thickness measurement method and apparatus thereof that can reduce the burden on an operator and improve production efficiency and yield, as well as a thin-film device fabrication system.

A first aspect of the present invention is a film-thickness measurement method capable of film-thickness measurement of at least one of a transparent conductive film and a transparent optical film, including irradiating the transparent conductive film or the transparent optical film, which is formed on a substrate conveyed through a manufacturing line, with light from a film surface side; detecting reflected light reflected at the transparent conductive film or the transparent optical film; measuring a color evaluation value of the detected reflected light; and determining a film thickness corresponding to the measured color evaluation value using a film-thickness characteristic in which the color evaluation value and the film thickness are associated.

The inventors found that the hue of reflected light from a transparent conductive film or a transparent optical film (they differ in that a transparent conductive film exhibits conductivity, whereas a transparent optical film does not exhibit conductivity) is related to the film thickness. In addition, the inventors found that the hue being related to the film thickness is a basic physical phenomenon. The main principle is optical interference. The thin-film multiple interference conditions change according to the film thickness of the transparent conductive film or the transparent optical film, and the reflection spectrum of the surface reflection of the object thus changes.

In the present invention, film-thickness measurement is possible by ascertaining this spectral change and quantifying it as a color evaluation value (hue). Regarding the reflection state, the mixing ratio of specular reflection and diffuse reflection changes depending on the smoothness of the underlying substrate of the object to be measured, but regardless of the smoothness of the substrate, the interference conditions change depending on the film thickness, and it was possible to confirm by observation, also experimentally, that the color evaluation value (hue) changes. In addition, a change in the reflection spectrum due to changes in the interference conditions with film thickness could be adequately confirmed also with thin-film multiple interference calculations using standard commercially available optical thin-film calculation software.

With the method described above, because the transparent conductive film or the transparent optical film formed on the substrate conveyed through the manufacturing line is irradiated with light, it is possible to easily perform film-thickness measurement without using a specialized measurement apparatus such as an interferometric film-thickness measurement apparatus. With the method described above, it is possible to perform nondestructive inspection of all fabricated substrates, thus improving the yield. It is possible to eliminate the need for cutting out a test piece from a substrate that is removed from the manufacturing line, thus allowing the burden on the operator to be reduced.

As the color evaluation value mentioned above, it is possible to use, for example, a color difference or RGB light intensity. As the color difference, it is possible to use, for example, a* and b* in the L*a*b* color system.

In the film-thickness measurement method described above, the film-thickness characteristic may be created by calculating the color evaluation values for a plurality of samples having different already-known film thicknesses and associating the measured color evaluation values and the film thicknesses.

Thus, by preparing a plurality of samples having known film thicknesses that are different from each other and irradiating these samples with light, the color evaluation value corresponding to each film thickness is measured, and on the basis of these measurement results, a film-thickness characteristic in which each film thickness is associated with the color evaluation value is created.

Accordingly, during film-thickness measurement, it is possible to easily determine the film thickness by using this film-thickness characteristic.

For example, as shown in FIG. 4, the above-described film-thickness characteristic is a graph produced by plotting points (a*, b*) at prescribed film-thickness intervals on a*b* coordinate axes, where a* is indicated on the horizontal axis and b* is indicated on the vertical axis, and by joining these points (a*, b*) with a straight line or an approximation function obtained by using the least squares method or the like. According to this method, as the reflected light to be evaluated, instead of measuring simply the reflected light intensity, it is possible to precisely measure the film thickness of the film to be measured by using the relation between the film thickness and a* and b* suitable for color evaluation.

A second aspect of the present invention is a film-thickness measurement apparatus capable of film-thickness measurement of at least one of a transparent conductive film and a transparent optical film, including a light radiating unit that irradiates the transparent conductive film or the transparent optical film, which is formed on a substrate conveyed through a manufacturing line, with light from a film surface side; a light detecting unit that detects reflected light reflected at the transparent conductive film or the transparent optical film; a color measuring unit that measures a color evaluation value of the detected reflected light; and a film-thickness measuring unit that determines a film thickness corresponding to the measured color evaluation value using a film-thickness characteristic in which the color evaluation value and the film thickness are associated.

With such a configuration, the light emitted from the light radiating unit is radiated onto the transparent conductive film or the transparent optical film formed on the substrate conveyed through the manufacturing line, and this reflected light is detected with the light detecting unit. The color evaluation value is measured by analyzing the detected light with the color measuring unit, and the film thickness corresponding to the measured color evaluation value is determined by the film-thickness measuring unit by using the film-thickness characteristic. Thus, because the substrate conveyed through the manufacturing line is irradiated with light, it is possible to easily perform film-thickness measurement without using a specialized measurement apparatus such as an interferometric film-thickness measurement apparatus.

In the film-thickness measurement apparatus described above, the film-thickness characteristic may be created by measuring the respective color evaluation values for a plurality of samples having known film thicknesses that are different from each other and by associating the measured color evaluation values and the film thicknesses.

With such a configuration, by preparing a plurality of samples having known film thicknesses that are different from each other and irradiating these samples with light, the color evaluation value corresponding to each film thickness is measured, and on the basis of these measurement results, a film-thickness characteristic in which each film thickness is associated with each color evaluation value is created. Therefore, during film-thickness measurement, it is possible to easily determine the film thickness by using this film-thickness characteristic.

In the film-thickness measurement apparatus described above, the light radiating unit may be disposed at a position where it is possible to radiate light onto the transparent conductive film or the transparent optical film formed on a thin-film device substrate conveyed through a thin-film device manufacturing line.

By disposing the light radiating unit in this way, it is possible to easily measure the film thickness of a transparent conductive film or a transparent optical film used in a thin-film device.

A third aspect of the present invention is a thin-film device fabrication system including the film-thickness measurement apparatus described above for monitoring the thin-film formation status.

A fourth aspect of the present invention is a thin-film device fabricated using the film-thickness measurement apparatus described above.

In the film-thickness measurement apparatus described above, as the thin-film device, it is possible to easily measure the film thickness of a transparent conductive film or a transparent optical film of a thin-film solar cell, a liquid crystal panel, or a semiconductor device. For example, for a thin-film solar cell, formation of a thin film on a large substrate with one edge exceeding 1 m with greater uniformity and more even quality is important for improving the electricity generating efficiency, and because it is possible to evaluate the film-thickness distribution over the entire surface of the substrate using the film-thickness measurement apparatus described above, this contributes to greatly improved electricity generating efficiency, yield, and fabrication efficiency.

The present invention affords an advantage in that it is possible to reduce the burden on an operator and to improve the fabrication efficiency.

Because variations in film thickness can be monitored, the present invention affords an advantage in that the device performance can be increased, yield can be improved, and fabrication efficiency can be improved.

Figure 1:
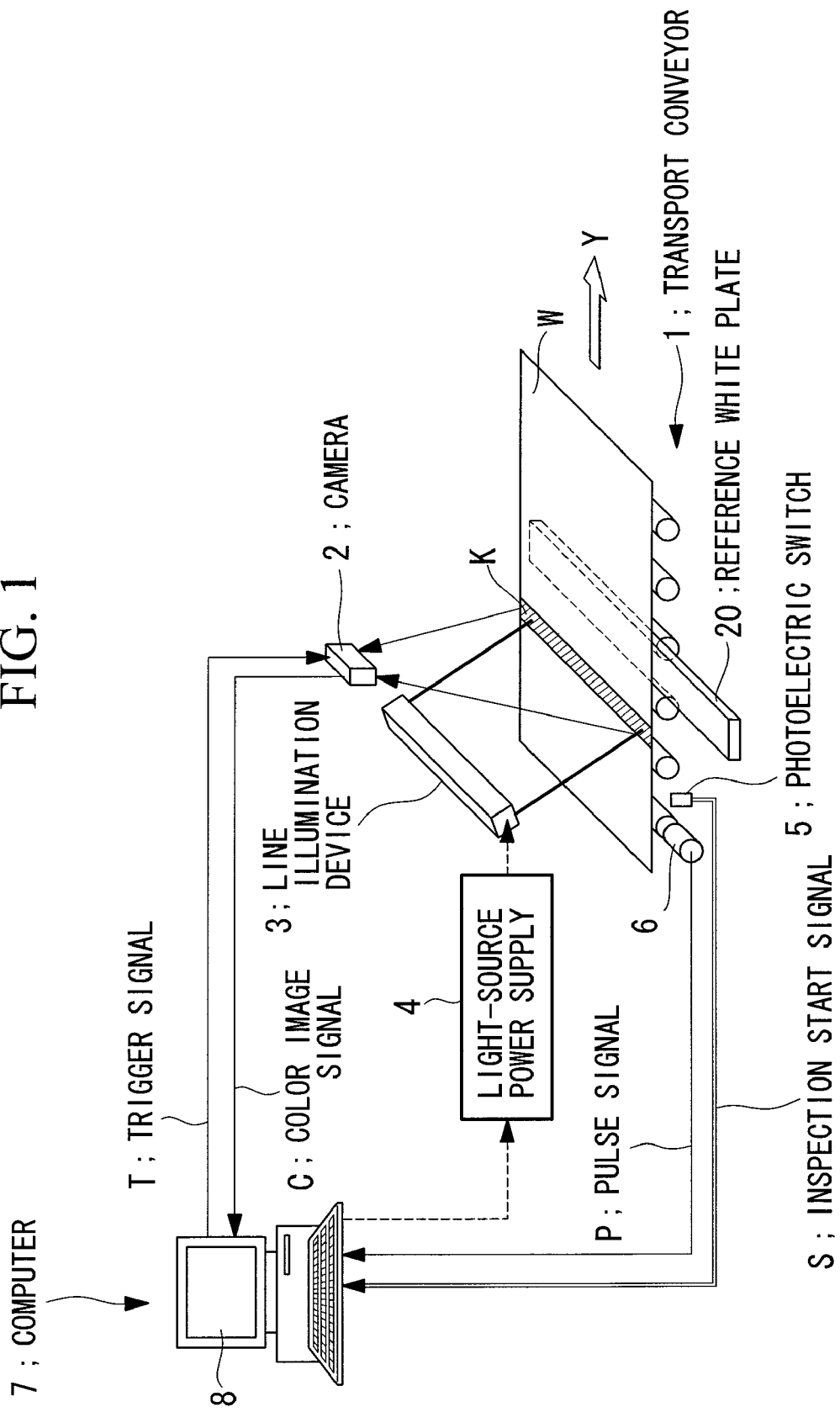
FIG. 1 is a diagram of the overall configuration of a film-thickness measurement apparatus according to a first embodiment of the present invention.

EXPLANATION OF REFERENCE SIGNS 1 transport conveyor
2 camera
3 line illumination device
4 light-source power supply
5 photoelectric switch
6 rotary encoder
7 computer
8 display device
W substrate

BEST MODE FOR CARRYING OUT THE INVENTION

Embodiments of a film-thickness measurement method and apparatus therefor, as well as a thin-film-device fabrication system, according to the present invention will be described below with reference to the drawings. The film-thickness measurement apparatus in each embodiment is provided for use in part of a manufacturing line in fabrication equipment for thin-film devices, in particular, thin-film solar cells. The film-thickness measurement apparatus according to each embodiment is suitable for performing film-thickness measurement of thin films formed on solar cell substrates, in particular, intermediate contact films.

The film-thickness measurement apparatus according to each embodiment is used for evaluating the film thickness of intermediate contact layers formed between each photoelectric conversion layer of tandem solar cells having photoelectric conversion layers with a two-layer pin-structure and triple solar cells having photoelectric conversion layers with a three-layer pin-structure. However, it is widely applicable to fabrication systems for fabricating solar cells having intermediate contact layers regardless of the solar cell structure. Here, the case where film-thickness measurement of an intermediate contact layer formed between a top cell and a bottom cell is performed in a manufacturing line of tandem solar cells is described as an example.

First Embodiment

FIG. 1 is a diagram showing the overall configuration of a film-thickness measurement apparatus according to a first embodiment of the present invention.

In the film-thickness measurement apparatus shown in FIG. 1, a substrate W is conveyed in a transport direction (Y direction in the figure) by a transport conveyor 1. This substrate W has a transparent electrode film formed by a thermal CVD apparatus, a top cell which is an amorphous silicon film photoelectric conversion layer formed by a plasma CVD apparatus, and an intermediate contact layer formed by a sputtering apparatus, formed in this order on a transparent glass substrate.

The intermediate contact layer is formed, for example, by laminating 10 nm to 150 nm of GZO (Ga-doped ZnO) with a sputtering apparatus. In FIG. 1, the transport conveyor 1 side of the substrate W is the transparent glass substrate, and the transparent conductive film and the photoelectric conversion layer formed of thin-film silicon are laminated at the side opposite the transport conveyor 1.

A camera (light detecting unit) 2 and a line illumination device (light radiating unit) 3 are disposed above the transport conveyor 1. In the camera 2, it is possible to use, for example, a color line sensor camera, a color area camera, a so-called CCD camera or the like. In this embodiment, a camera constructed of an image-acquisition device (for example, a CCD device) and an image-acquiring lens system is employed as the camera 2.

The line illumination device 3 is formed, for example, of a fluorescent lamp, and light level adjustment and on/off control of the light source are performed by the operation of a light-source power supply 4 on the basis of signals received from a computer 7, described later. The line illumination device 3 is not limited to a fluorescent lamp, so long as it is a light source that can radiate white light in the form of a line; line LED illumination formed by arranging LED devices in a straight line may be used.

Figure 2:
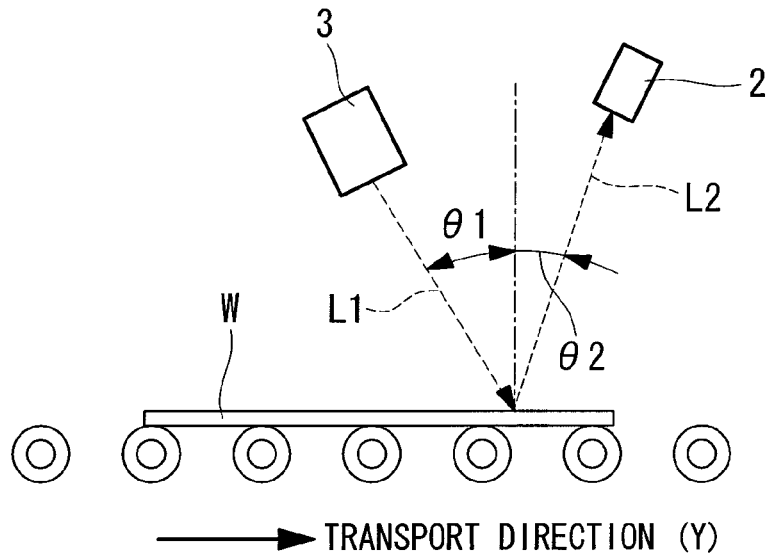
FIG. 2 is a diagram showing the positional relationship of a camera and a line illumination device.

As shown in FIG. 2, the camera 2 and the line illumination device 3 are disposed facing the film surface to be measured so as to form a reflection-type inspection apparatus. That is, regarding the line illumination device 3, emitted line illumination light L1 is reflected at the upper surface of the substrate W, in this embodiment, the surface of the intermediate contact layer formed on the surface of the substrate W. The camera 2 is disposed at a position where line reflected light L2 reflected at the surface of the intermediate contact layer is incident, and is designed to receive the reflected light L2 reflected from a portion on the surface of the substrate W where the line illumination light L1 falls (line-shaped portion K in FIG. 1).

The positions at which the camera 2 and the line illumination device 3 are disposed are set so that an incidence angle θ1 of the line illumination light L1 falling on the substrate W is about 45°, and a reflection angle θ2 of the line reflected light L2 reflected at the substrate W is about 0°. In the film-thickness measurement apparatus according to this embodiment, θ1 should be any angle from about 0° to about 90°, and θ2 should be close to 0°. Such an arrangement facilitates positional adjustment of the camera, in other words, focusing.

A photoelectric switch 5 and a rotary encoder 6 are disposed on the transport conveyor 1. When the photoelectric switch 5 detects that a front end portion of the conveyed substrate W has reached the incident position of the line illumination light L1, that is, a line image acquisition position to be acquired by the camera 2, it generates an inspection start signal S and sends it to the computer 7. The rotary encoder 6 generates a pulse signal P and sends it to the computer 7 each time it rotates by a prescribed angle, that is, each time the substrate W moves a prescribed distance.

A reference white plate 20 is provided below the transport conveyor 1 at a position where the line illumination light L1 is radiated. This reference white plate 20 is used for obtaining color information serving as a reference. The material of the reference white plate is not particularly specified; any material considered as white in the technical field of image acquisition can be used. For example, it is possible to use a white plate commonly used in spectroscopy (made by consolidating aluminum sulfate powder into pellets), white paper, or a white reference etc. commonly used in commercial colorimetry.

After receiving the inspection start signal S, the computer 7 sends a trigger signal T to the camera 2 each time it receives a pulse signal P. Each time the camera 2 receives the trigger signal T, it acquires an image of the substrate W, takes in the reflected light from the line illumination device 3, generates a color image signal C containing image information for one line with the lateral width of the substrate W and the longitudinal width in the moving direction, and sends it to the computer 7. This color image signal C contains, for example, a red-component image signal R, a green-component image signal G, and a blue-component image signal B.

When the computer (color measuring unit and film-thickness measuring unit) 7 receives the color image signal C from the camera 2, it creates a two-dimensional image showing the surface image of the substrate W by two-dimensionally arranging these color image signals C in a memory.

The computer 7 performs film-thickness measurement of the intermediate contact layer formed on the substrate W by executing film-thickness measurement processing, described later, on the two-dimensional image created. A display device 8, such as a CRT, is connected to the computer 7, and the waveform of the color image signals C, a two-dimensional image subjected to image processing, a film-thickness distribution, measurement results, and so forth are displayed on this display device 8.

Next, a case where the film thickness of the intermediate contact layer is measured with the film-thickness measurement apparatus shown in FIG. 1 will be described.

First, with the line illumination device 3 turned on, the computer 7 causes the substrate W mounted on the transport conveyor 1 to be conveyed in the transport direction Y. Accordingly, the line illumination light L1 emitted from the line illumination device 3 (see FIG. 2) is reflected at the intermediate contact layer formed on the surface of the substrate W. Also, pulse signals P are sent from the encoder 6 to the computer 7 in accordance with the movement of the substrate W.

The computer 7 sends the trigger signal T to the camera 2 each time it receives this pulse signal P. Thus, the line reflected light L2 (see FIG. 2) is received by the camera 2 as the substrate W is moved, and the color image signals C are sequentially sent to the computer 7. When the computer 7 receives many lines of the color image signals C from the camera 2, they are arranged two-dimensionally to create a two-dimensional image.

When the two-dimensional image is created in this way, the computer 7 performs film-thickness measurement by executing the film-thickness measurement process illustrated in the following. The film-thickness measurement process is described concretely below.

First, a film-thickness characteristic used in the film-thickness measurement process will be described here.

This film-thickness characteristic shows the relation between the film thickness of the intermediate contact layer and the color (hereinafter referred to as "color evaluation value") of the reflected light when the intermediate contact layer is irradiated with light.

As the color evaluation value, it is possible to use various parameters representing color. For example, it is possible to use the light intensity of each color in RGB, XYZ values in the CIE-XYZ color system, or L*a*b* values in the CIE-L*a*b* color system. L*a*b* is the L*a*b* (L star, a star, b star) color system defined in JIS Z 8729, representing color differences. L* represents lightness (brightness), a* represents the chromaticness index of red-to-green hues, and b* represents the chromaticness index of yellow-to-blue hues.

To evaluate the film thickness, rather than simply the reflected light intensity, the relation between the film thickness and parameters (a*, b*) suitable for color evaluation is found, and this is used. Here, a method of creating a film-thickness characteristic when the values of a* and b* in the CIE-L*a*b* color system are used as the color evaluation value will be described with reference to FIG. 3.

First, measurement and evaluation are performed with a separate interferometric film-thickness measurement apparatus or the like, samples with substantially the same structure as the substrates of the films to be evaluated, having different known film thicknesses, are prepared with prescribed film-thickness increments, these samples are mounted on the transport line 1 shown in FIG. 1 and are irradiated with illumination light from the line illumination device 3, the reflected light is received by the camera 2, and image processing is performed in the computer 7. The light evaluation value of the reflected light at this time, that is to say, the values of a* and b* in the CIE-L*a*b* color system, is measured (step SA1 in FIG. 3).

Figure 3:
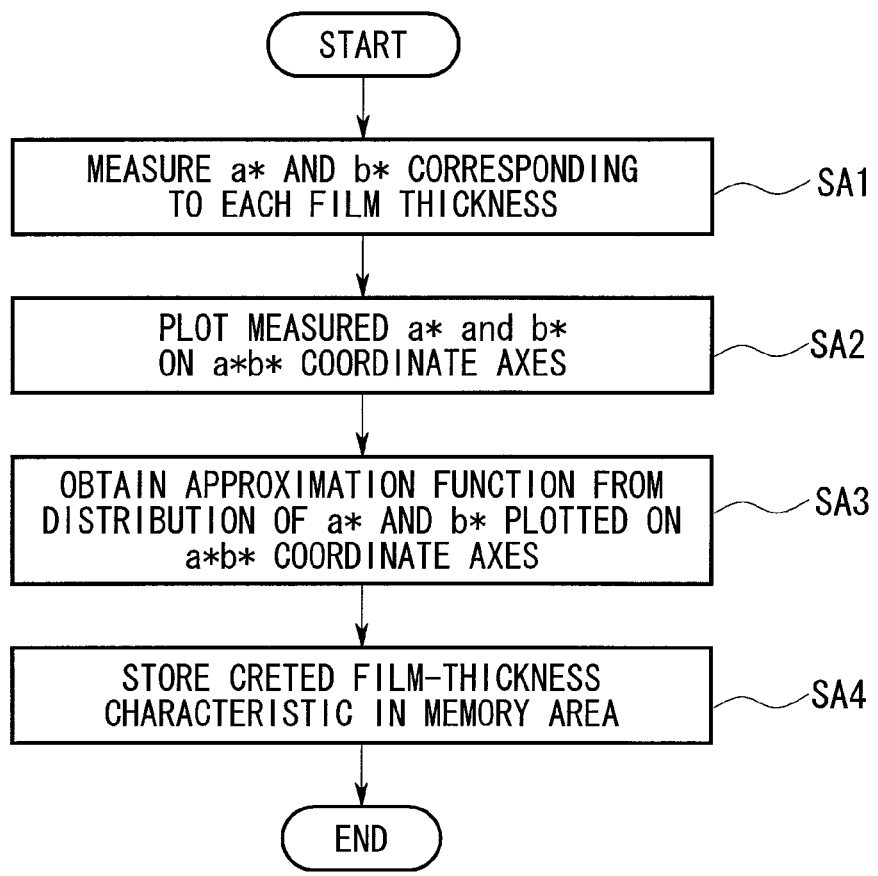
FIG. 3 is a flowchart showing a procedure for creating a film-thickness characteristic.
Figure 4:
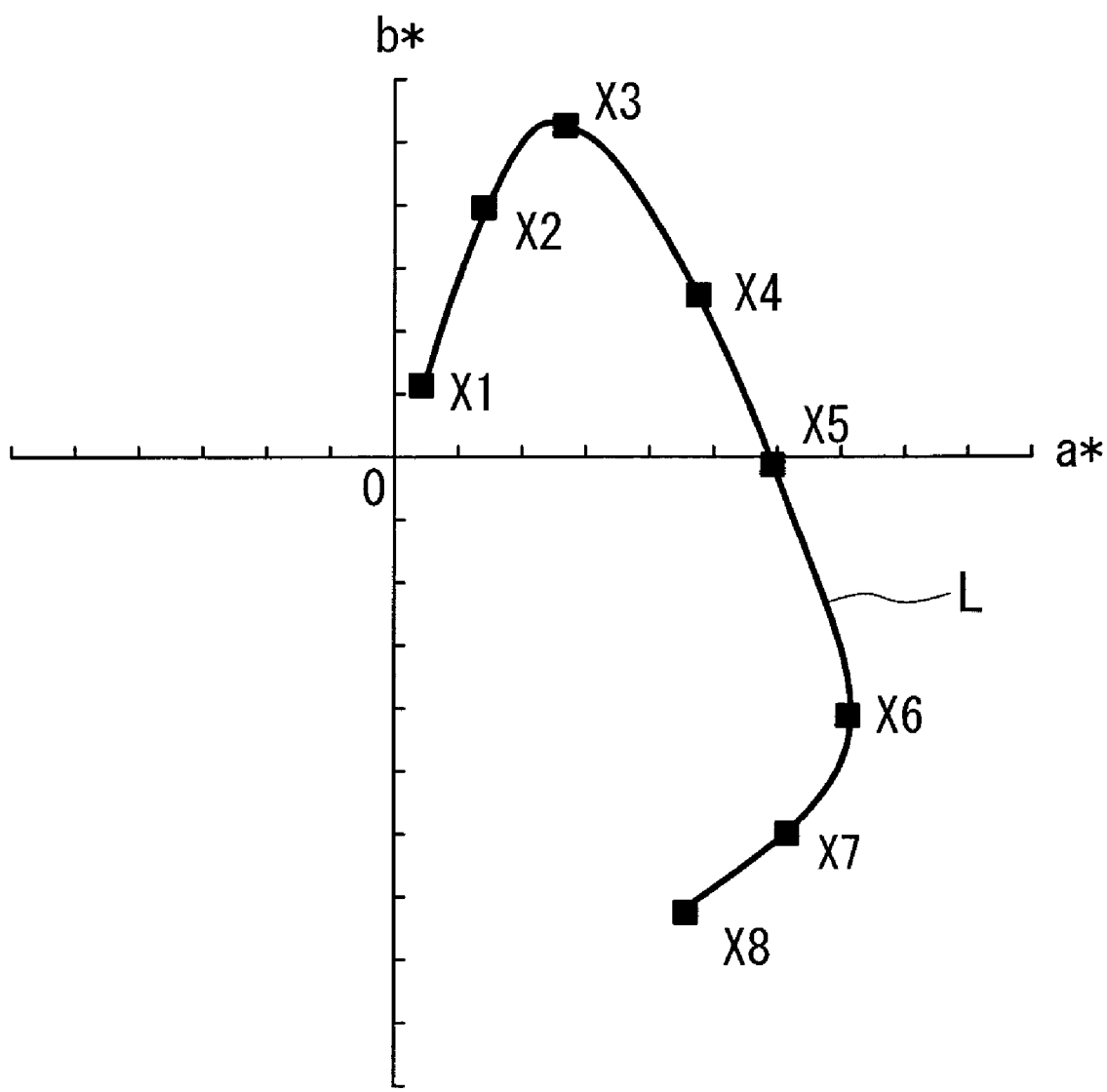
FIG. 4 is a diagram showing an example of a film-thickness characteristic.

Next, as shown in FIG. 4, a point (a*, b*) corresponding to each film thickness measured in Step SA1 is plotted on the a*b* coordinate axes, where a* is shown on the horizontal axis and b* is shown on the vertical axis (Step SA2 in FIG. 3), and these points (a*, b*) are represented as an approximation function using the least squares method or the like (Step SA3 in FIG. 3). A suitable known technique can be used as the method of obtaining the characteristic function from a distribution of multiple plots.

As a result, as shown in FIG. 4, a film-thickness characteristic associating each film thickness with each color evaluation value is created. The created film-thickness characteristic is stored in a prescribed memory area provided in the computer 7 (Step SA4 in FIG. 3) and is used in a film-thickness measurement process, described later.

FIG. 4 shows an example of a thick-film characteristic obtained by plotting points (a*, b*) for eight samples X1 to X8 having known film thicknesses prepared in fixed film-thickness increments and joining them with an approximation function.

The main film-thickness measurement principle, optical interference, makes use of the varying reflection spectrum of the surface reflection of an object as the multiple interference condition of the thin film changes according to the film thickness of a transparent conductive film or a transparent optical film.

Multiple interference in a film whose film thickness is to be evaluated is affected by irregularities in an underlying film, for example, a transparent conductive film in a solar cell, and the top layer, and the multiple interference conditions in the film may change thereby. Therefore, when creating a film-thickness characteristic like that in FIG. 4 based on the film thicknesses of the samples, the underlying film and the film thicknesses are more preferably closer to those to be actually evaluated.

Next, the film-thickness measurement process performed using the above-described film-thickness characteristic will be described.

Figure 5:
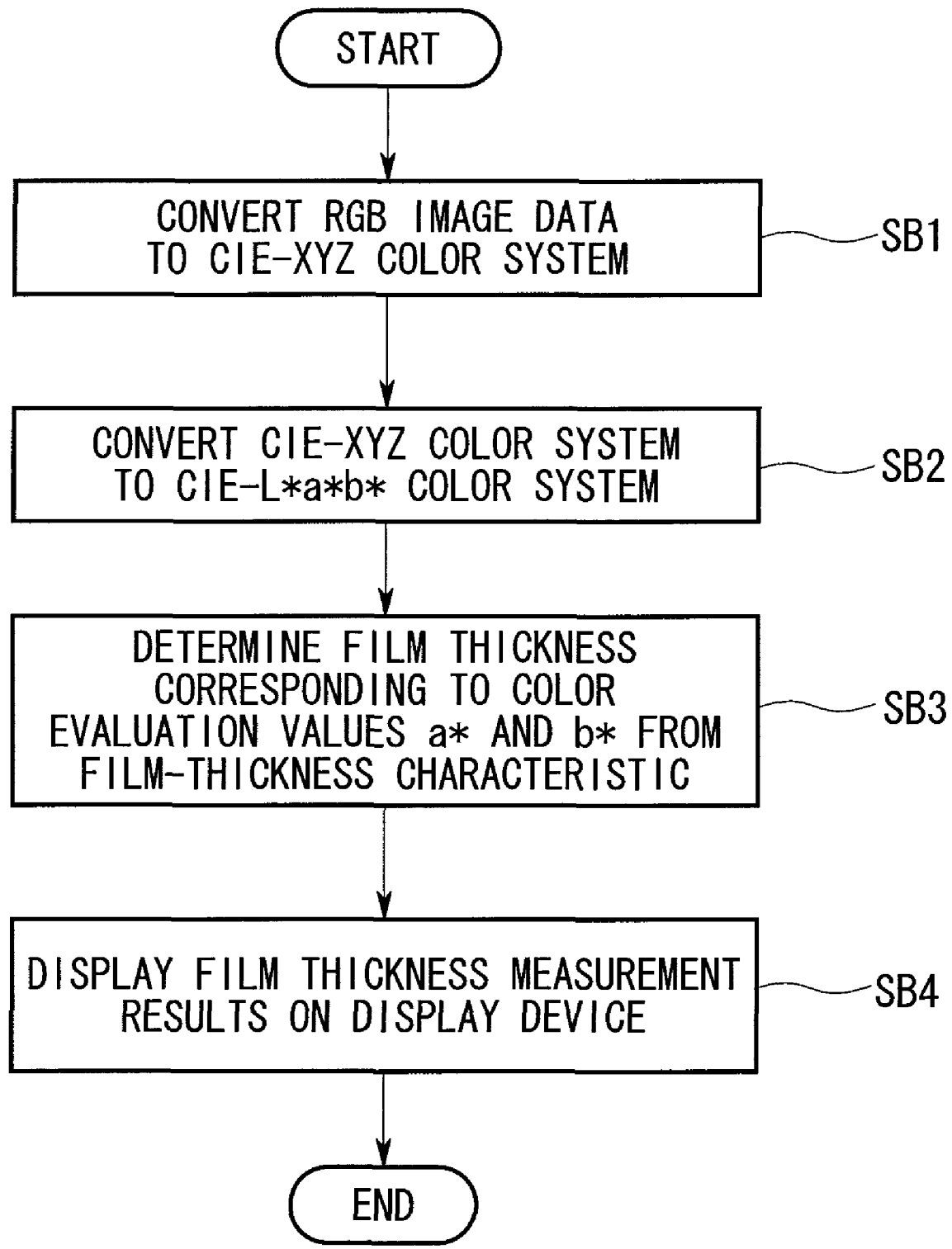
FIG. 5 is a flowchart showing a processing procedure of a film-thickness measurement process according to the first embodiment of the present invention.

First, the color evaluation value is measured by subjecting the two-dimensional image created on the basis of the color image signals C from the camera 2 to image processing in the computer 7. More specifically, the computer 7 converts from RGB image data to the CIE-XYZ color system (Step SB1 in FIG. 5), and then obtains color difference data by converting the CIE-XYZ color system to the CIE-L*a*b* color system (Step SB2). A known method may be used for these conversions.

When the L*a*b* values in the two-dimensional image are obtained at each pixel in this way, the computer 7 determines the film thickness corresponding to the color evaluation values a*b* at each pixel using the film-thickness characteristic shown in FIG. 4 (Step SB3). At this time, if the evaluation value a*b* detected in Step SB2 described above deviates from the characteristic line L shown in FIG. 4, a value on the characteristic line L which is closest to the detected color evaluation value is determined, and a film thickness corresponding to this value (a*, b*) is obtained using the least squares method or the like.

When the computer 7 obtains the film thickness at each pixel, it displays the film thickness measurement results and the film-thickness distribution on the display device 8 (Step SB4). The display mode can be set based on a suitable design. For example, it is possible to register a correct range of film thicknesses in advance and to display only a pixel region of film-thicknesses having values outside the correct range in color. Alternatively, the film thicknesses may be categorized into multiple steps and displayed in different colors in each category.

As described above, with the film-thickness measurement apparatus according to this embodiment, because a substrate W conveyed through a solar cell manufacturing line is irradiated with light and the film thickness of the intermediate contact layer is measured using the color evaluation value of the reflected light thereof, it is possible to easily perform film-thickness measurement of the entire surface of the substrate W without using a specialized measurement apparatus such as an interferometric film-thickness measurement apparatus. As a result, it is not necessary to cut out a test piece from a substrate removed from the manufacturing line, and the burden on the operator can thus be reduced.

In addition, all intermediate contact layers formed by a sputtering apparatus can be judged as being acceptable or defective on the basis of the measurement results of this film thickness distribution, and if defective products are detected, the defective substrates can be removed from the line during processing, and the film-formation conditions etc. of the sputtering apparatus can be adjusted as required.

In addition, in the event of defective film formation due to a problem that the sputtering apparatus itself cannot detect, such a situation can be identified immediately and corrective measures quickly taken.

In other words, by performing evaluation using standard values of the average film thickness, which is the item to be controlled, and the film-thickness distribution and by monitoring the film-formation status on-line, production conditions giving high electricity generating efficiency are maintained, and the occurrence of defects is identified in an extremely short period of time; hence, the film-formation quality is stable and the yield is improved. Accordingly, the fabrication efficiency is improved.

In this embodiment, the film thickness is detected at each pixel. Instead of this, however, an average film thickness may be determined for each prescribed region. For example, in Step SB1 in FIG. 5, the two-dimensional image may be divided into prescribed regions and average RBG data value calculated in each region, and then, by proceeding with the process using this average value, the average film thickness may be determined in each region. By determining the film thickness in this way in each region, it is possible to reduce the amount of processing.

Furthermore, the computer 7 may judge defective substrates according to the film thickness at each pixel or each region calculated in the film-thickness measurement process described above. For example, a correct range for the film thickness or film thickness distribution may be registered in the computer 7, and a surface area where the film thickness is outside the correct range may be determined. If the ratio of this surface area relative to the surface area of the entire substrate exceeds a reference value set in advance, or if the film thickness distribution exceeds a reference value set in advance, the product is judged as being defective and is so indicated on the display device 8.

Second Embodiment

A film-thickness measurement apparatus according to a second embodiment of the present invention will be described next. The film-thickness measurement apparatus according to this embodiment is substantially the same as the film-thickness measurement apparatus according to the first embodiment described above, but the placement of the camera 2 and the line illumination device 3 is different.

Differences from the film-thickness measurement apparatus according to the first embodiment will mainly be described below.

In the film-thickness measurement apparatus according to this embodiment, the positions at which the camera 2 and the line illumination device 3 are disposed are set so that, in FIG. 2 for example, the incidence angle θ1 of the line illumination light L1 falling on the substrate W is close to about 0°, and the reflection angle θ2 of the line reflected light L2 reflected at the substrate W is any angle from about 0° to about 90°. For example, the positions at which the camera 2 and the line illumination device 3 are disposed are set so that the incidence angle θ1 of the line illumination light L1 falling on the substrate W is about 0° and the reflection angle θ2 of the line reflected light L2 reflected at the substrate W is about 45°.

Such a placement facilitates positional adjustment of the line illumination device, that is to say, luminance distribution adjustment.

Third Embodiment

Next, a film-thickness measurement apparatus according to a third embodiment of the present invention will be described below. The film-thickness measurement apparatus according to this embodiment is substantially the same as the film-thickness measurement apparatus according to the first embodiment described above, but the placement of the camera 2 and the line illumination device 3 is different.

Differences from the film-thickness measurement apparatus according to the first embodiment will mainly be described below.

In the film-thickness measurement apparatus according to this embodiment, the positions at which the camera 2 and the line illumination device 3 are disposed are set so that, in FIG. 2 for example, the incidence angle θ1 of the line illumination light L1 falling on the substrate W and the reflection angle θ2 of the line reflected light L2 reflected at the substrate W are substantially the same. For example, the incidence angle θ1 of the line illumination light L1 is set to any angle from about 0° to about 90°. As one example, the incidence angle θ1 and the reflection angle θ2 are set to any angle from about 17° to about 18°.

Such a placement allows specularly reflected light to be received and is therefore advantageous in that the received light level is high and this placement is immune to disturbances caused by stray light etc.

Each of the embodiments described above has been described in terms of an example case where the film thickness of an intermediate contact layer of a tandem solar cell is measured by the film-thickness measurement apparatus; however, it is not limited thereto. For example, it is also possible to perform film-thickness measurement of a transparent conductive film or a transparent optical film used in a thin-film solar cell, more specifically, a multijunction solar cell. For example, in the case of a triple solar cell, it can be used for film-thickness measurement of an intermediate contact layer etc. formed between the top photoelectric conversion layer and the middle photoelectric conversion layer, between the middle photoelectric conversion layer and the bottom photoelectric conversion layer, and so on.

Also, for a rear surface electrode formed of a second transparent conductive film and a metal electrode film, it can be used for film-thickness measurement of this second transparent conductive film.

In the thin-film solar cell described above, crystalline silicon means silicon other than amorphous silicon, that is, non-crystalline silicon, and also includes microcrystalline silicon and polycrystalline silicon.

Furthermore, the film-thickness measurement apparatus of this invention is not limited to the field of thin-film solar cells and can be widely applied to fields in which transparent conductive films or transparent optical films are used, such as liquid crystal panels, semiconductor devices, and so forth. In such a case, the line illumination device 3 described above should be disposed at a position where light can be radiated onto the transparent conductive film or the transparent optical film formed on the substrate conveyed in each fabrication step, and the reflected light thereof should be received by the camera 2.

The invention claimed is:

1. A film-thickness measurement method capable of film-thickness measurement of at least one of a transparent conductive film and a transparent optical film, comprising:
   irradiating the transparent conductive film or the transparent optical film, which is formed on a substrate conveyed through a manufacturing line, with light from a film surface side;
   detecting reflected light reflected at the transparent conductive film or the transparent optical film;
   measuring a color evaluation value of the detected reflected light; and
   determining a film thickness corresponding to the measured color evaluation value using a film-thickness characteristic in which the color evaluation value and the film thickness are associated,
   wherein the film-thickness characteristic is created by calculating the color evaluation values for a plurality of samples having different already-known film thicknesses and associating the measured color evaluation values and the film thicknesses.

2. A film-thickness measurement apparatus capable of film-thickness measurement of at least one of a transparent conductive film and a transparent optical film, comprising:
   a light radiating unit that irradiates the transparent conductive film or the transparent optical film, which is formed on a substrate conveyed through a manufacturing line, with light from a film surface side;
   a light detecting unit that detects reflected light reflected at the transparent conductive film or the transparent optical film;
   a color measuring unit that measures a color evaluation value of the detected reflected light; and
   a film-thickness measuring unit that determines a film thickness corresponding to the measured color evaluation value using a film-thickness characteristic in which the color evaluation value and the film thickness are associated,
   wherein the film-thickness characteristic is created by measuring the respective color evaluation values for a plurality of samples having known film thicknesses that are different from each other and by associating the measured color evaluation values and the film thicknesses.

3. A film-thickness measurement apparatus according to claim 2, wherein the light radiating unit is disposed at a position where it is possible to radiate light onto the transparent conductive film or the transparent optical film formed on a thin-film device substrate conveyed through a thin-film device manufacturing line.

4. A thin-film device fabrication system comprising the film-thickness measurement apparatus according to claim 3 for monitoring the thin-film formation status.

5. A thin-film device fabricated using the film-thickness measurement apparatus according to claim 3.

6. A film-thickness measurement apparatus capable of film-thickness measurement of at least one of a transparent conductive film and a transparent optical film, comprising:
   a light radiating unit that irradiates the transparent conductive film or the transparent optical film, which is formed on a substrate conveyed through a manufacturing line, with light from a film surface side;
   a light detecting unit that detects reflected light reflected at the transparent conductive film or the transparent optical film;
   a color measuring unit that measures a color evaluation value of the detected reflected light; and
   a film-thickness measuring unit that determines a film thickness corresponding to the measured color evaluation value using a film-thickness characteristic in which the color evaluation value and the film thickness are associated,
   wherein the light radiating unit is disposed at a position where it is possible to radiate light onto the transparent conductive film or the transparent optical film formed on a thin-film device substrate conveyed through a thin-film device manufacturing line.

7. A thin-film device fabrication system, for monitoring the thin-film formation status, including:
   a film-thickness measurement apparatus capable of film-thickness measurement of at least one of a transparent conductive film and a transparent optical film, comprising:
   a light radiating unit that irradiates the transparent conductive film or the transparent optical film, which is formed on a substrate conveyed through a manufacturing line, with light from a film surface side;
   a light detecting unit that detects reflected light reflected at the transparent conductive film or the transparent optical film;

a color measuring unit that measures a color evaluation value of the detected reflected light; and a film-thickness measuring unit that determines a film thickness corresponding to the measured color evaluation value using a film-thickness characteristic in which the color evaluation value and the film thickness are associated, wherein the light radiating unit is disposed at a position where it is possible to radiate light onto the transparent conductive film or the transparent optical film formed on a thin-film device substrate conveyed through a thin-film device manufacturing line.

8. A thin-film device fabricated using a film-thickness measurement apparatus capable of film-thickness measurement of at least one of a transparent conductive film and a transparent optical film, comprising:

a light radiating unit that irradiates the transparent conductive film or the transparent optical film, which is formed on a substrate conveyed through a manufacturing line, with light from a film surface side;

a light detecting unit that detects reflected light reflected at the transparent conductive film or the transparent optical film;

a color measuring unit that measures a color evaluation value of the detected reflected light; and a film-thickness measuring unit that determines a film thickness corresponding to the measured color evaluation value using a film-thickness characteristic in which the color evaluation value and the film thickness are associated, wherein the light radiating unit is disposed at a position where it is possible to radiate light onto the transparent conductive film or the transparent optical film formed on a thin-film device substrate conveyed through a thin-film device manufacturing line.

* * * * *